(12) United States Patent
Hayashi

(10) Patent No.: US 6,426,790 B1
(45) Date of Patent: Jul. 30, 2002

(54) STAGE APPARATUS AND HOLDER, AND SCANNING EXPOSURE APPARATUS AND EXPOSURE APPARATUS

(75) Inventor: Yutaka Hayashi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/514,584

(22) Filed: Feb. 28, 2000

(51) Int. Cl.⁷ .................. G03B 27/58; G03B 27/42
(52) U.S. Cl. .................................. 355/72; 355/53
(58) Field of Search .............. 355/53, 72; 501/9; 248/476; 359/871, 872, 873; 356/508

(56) References Cited

U.S. PATENT DOCUMENTS

| | | | |
|---|---|---|---|
| 4,758,091 A | * 7/1988 | Bodine | 356/508 |
| 5,589,304 A | * 12/1996 | Chiba et al. | 430/5 |
| 5,781,338 A | * 7/1998 | Kapitza | 359/398 |
| 5,846,676 A | * 12/1998 | Chiba et al. | 430/5 |
| 6,012,697 A | 1/2000 | Ohtomo et al. | 248/476 |
| 6,020,750 A | * 2/2000 | Berger et al. | 324/755 |
| 6,265,334 B1 | 7/2001 | Sechi et al. | 501/9 |

FOREIGN PATENT DOCUMENTS

| | | |
|---|---|---|
| JP | A-11-74334 | 3/1999 |
| JP | A-11-219876 | 8/1999 |

\* cited by examiner

*Primary Examiner*—Russell Adams
*Assistant Examiner*—R. Fuller
(74) *Attorney, Agent, or Firm*—Oliff & Berridge, PLC

(57) ABSTRACT

A stage apparatus of the invention comprises: a holder for holding a substrate, and a position detection device for detecting a position of the substrate, based on reflected light from a mobile mirror provided at a predetermined positional relationship with the holder. The holder and a base material of the mobile mirror consist of ceramics having a coefficient of thermal expansion of $1\times10^{-6}/°$ C. or less. With such an apparatus, costs related to temperature control can be reduced.

27 Claims, 4 Drawing Sheets

STAGE APPARATUS AND HOLDER, AND SCANNING EXPOSURE APPARATUS AND EXPOSURE APPARATUS

BACKGROUND OF THE INVENTION

1. Field of the Invention

The present invention relates to a holder for holding a substrate such as a mask or a wafer, such substrates, a stage apparatus for holding and moving the holder, and an exposure apparatus for performing exposure processing using a mask and a substrate held by the stage apparatus. Moreover, the invention relates to a scanning exposure apparatus for performing exposure while moving the stage.

2. Description of the Related Art

Heretofore, various exposure apparatus have been used when manufacturing semiconductor devices or liquid crystal display devices by a lithography process. Presently however, projection exposure apparatus are typically being used, which transfer a pattern image of a photo mask or a reticle (hereinafter, generally referred to as "reticle") onto a substrate such as a wafer or a glass plate, on the surface of which a photosensitive material such as a photoresist or the like is applied, via a projection optical system. Recently, as such projection exposure apparatus, a so-called step and repeat type reduced size projection exposure apparatus (a so-called stepper) is becoming predominant. With this apparatus a substrate is mounted on a two-dimensionally moveable substrate stage, and the substrate is stepped by the substrate stage, to thereby repeat an operation for exposing a pattern image of the reticle onto each shot area on the substrate in sequence.

Recently a step and scan type projection exposure apparatus (a scanning exposure apparatus as described for example in Japanese Unexamined Patent Application, First Publication No. 7-176468) which is an improvement on a static type exposure apparatus such as the stepper, is being used to a considerable degree. The step and scan type projection exposure apparatus (scanning stepper) can expose a larger field with a smaller optical system, compared to the stepper. Hence there are merits in that production of the projection optical system is facilitated, that high throughput can be expected due to a decrease in the number of shots by using the large field exposure, that a balancing effect is obtained by scanning the reticle and the wafer relative to the projection optical system, and that improvement of the distortion and the depth of focus can be expected. Moreover, it is being said that as the degree of integration of the semiconductor device is increased from a DRAM of 16 MB (megabyte) to a DRAM of 64 MB, and further in the future, will be increased to 256 MB, and even to 1 GB (gigabyte) with time, a large field will become essential. Hence the scanning projection exposure apparatus will become predominant instead of the stepper.

In such a stepper or scanning stepper, a table which can be moved in the direction of the optical axis for adjustment of the focal position and is capable of leveling adjustment is installed on a stage. Then, a holder for attracting and holding a substrate, and a mobile mirror for reflecting the detection light are provided on the stage in a predetermined positional relationship. Detection light is then irradiated from a position detection device, such as a laser interferometer or the like arranged opposite to the mobile mirror, and a distance from the stage is measured based on the reflected light from the mobile mirror, to thereby detect the position of the substrate to a high precision. As for the reticle, in a similar manner, a mobile mirror is provided on a reticle stage that attracts and holds the reticle. Detection light is then irradiated from the position detection device, and a distance from the reticle stage is measured, to thereby detect the position of the reticle to a high precision.

As described above, with the integration of semiconductor devices, the circuits are being made finer, and the line width thereof is becoming highly precise in the order of sub-microns. Therefore, the precision required for such exposure apparatus for forming a circuit pattern as described above is increasing year after year, and positioning precision of for example 5 to 10 nm or less is required. Consequently, in the stage portion of the exposure apparatus, positioning precision of about 1 nm is required.

Conventionally, as one means for realizing such high-precision positioning, attempts have been made where the exposure apparatus is installed in a chamber, the temperature of which is strictly controlled, and the stages are separately installed in housings, the temperature of which is more strictly controlled. As a result, expansion and contraction of the stages due to the change in temperature is suppressed, and positioning error resulting from the temperature change is eliminated.

Moreover, as for the holder, in a condition with the substrate supported by a multiplicity of fine protrusions with tips lying in a single plane, an approximately closed off space between the holder and the substrate is reduced in pressure for attachment, thereby reducing the contact area between the holder and the substrate. As a result, a situation where the flatness of the substrate is deteriorated due to dust and dirt caught between the substrate and the holder can be prevented, thereby eliminating positioning error resulting from deterioration of flatness.

However, with the above described conventional stage apparatus and holder, and scanning exposure apparatus and exposure apparatus, problems as described below exist.

The diameter of substrates is being increased in order to improve production efficiency, and wafers having an outer diameter of about 300 mm have recently been developed and put to practical use. In this case, the distance between the center of the wafer and the mobile mirror becomes about 200 mm, and even if ceramics having a relatively small thermal expansion, such as alumina, silicon nitride or the like are used for the holder and the mobile mirror, as in the conventional case, it is necessary to control the atmosphere temperature at the stage portion to the order of 0.001° C. in order to ensure positioning precision of 1 nm. Hence, there are such problems that cost relating to temperature control is significantly increased, and if the temperature control is out of order due to unforeseen circumstances, the possibility of the positioning precision not being satisfied increases.

In particular, in the case of an exposure apparatus that performs double exposure by using a plurality of reticles for high resolution exposure, two reticles for example are provided in a row and held on the reticle stage. However, there is a problem in that with the position measurement for the reticle on the far side from the mobile mirror in the row direction, the distance between the reticle and the mobile mirror is further increased. Hence higher precision temperature control is required.

Moreover, even if the atmosphere temperature is controlled within a predetermined range, and the contact area between the holder and the substrate is very small, the heat accompanying the exposure processing is applied to the holder via the substrate, resulting in thermal expansion. Therefore, if the substrate is subjected to exposure processing over a plurality of shot areas, the holder undergoes thermal expansion with the progress of the exposure processing. Hence, the expansion length becomes different between shot areas on the substrate, causing a problem in that high-precision superposition onto this layer becomes difficult for each shot area.

SUMMARY OF THE INVENTION

In view of the above situation, it is an object of the present invention to provide a stage apparatus and holder, and a scanning exposure apparatus and an exposure apparatus which can maintain positioning precision relative to the substrate, without excessively relying on the precision of temperature control.

To achieve the above described object, the present invention adopts the following construction.

The stage apparatus of the present invention comprises: a holder for holding a substrate, and a position detection device for detecting a position of the substrate, based on reflected light from a mobile mirror provided at a predetermined positional relationship with the holder, and the holder and a base material of the mobile mirror consist of ceramics having a coefficient of thermal expansion of $1 \times 10^{-6}/°$ C. or less.

Therefore, with the stage apparatus of the present invention, if the substrate and the mobile mirror are arranged at a distance of for example 200 mm, a variation in the atmosphere temperature of up to about 0.005° C. can be allowed in order to ensure a positioning error of not larger than 1 nm due to temperature change. Accordingly, the degree of dependence on temperature control is reduced, enabling a reduction in costs. As a ceramics having such a low thermal expansion, a cordierite type ceramics is preferable. A cordierite type ceramics consists generally of a composition of $2MgO-2Al_2O_3-5SiO_2$, and is obtained by blending respective metal oxides at a predetermined ratio, molding these to a predetermined shape, and sintering in an oxidizing atmosphere at 1300 to 1550° C. Moreover, with the stage apparatus, when a predetermined positioning precision is maintained, the effect is obtained in that the degree of dependence on temperature control can be alleviated and costs associated with temperature control can be reduced.

A stage apparatus in an other embodiment of the present invention is constructed such that the holder and the base material of the mobile mirror comprise a ceramics having a coefficient of thermal expansion of $0.5 \times 10^{-6}/°$ C. or less. With this stage apparatus, a variation in the atmosphere temperature of up to about 0.01° C. can be allowed. Hence the effect is obtained in that the degree of dependence on temperature control can be further alleviated and costs associated with temperature control can be greatly reduced.

A stage apparatus in an other embodiment of the present invention is constructed such that a mobile mirror and a holder are held by a common base. With this stage apparatus, the effect is obtained in that thermal expansion of the mobile mirror and the holder held by the base, due to the temperature change can be kept low and the degree of dependence on temperature control can be alleviated.

A stage apparatus in an other embodiment of the present invention is constructed such that at least a part of the base is ceramics. With this stage apparatus, the effect is obtained in that stress resulting from a difference in the expansion length does not occur. Hence factors causing positioning error can be removed beforehand.

A stage apparatus in an other embodiment of the present invention is constructed such that a movable stage for integrally moving the mobile mirror and the holder is provided. With this stage apparatus, the effect is obtained in that thermal expansion due to the temperature change with respect to the moving mobile mirror and holder can be kept low. Hence the degree of dependence on temperature control can be reduced.

A stage apparatus in an other embodiment of the present invention is constructed such that at least a part of a movable stage is ceramics. With this stage apparatus, the effect is obtained in that the occurrence of a positioning error due to thermal expansion of the movable stage can be suppressed.

A stage apparatus in an other embodiment of the present invention is constructed such that a support member for movably supporting the movable stage is provided. With this stage apparatus, the effect is obtained in that the occurrence of a positioning error due to thermal expansion of the movable stage supported by the support member can be suppressed.

A stage apparatus in an other embodiment of the present invention is constructed such that at least of a part of the support member is ceramics.

As a result, with this stage apparatus, the effect is obtained in that the occurrence of a positioning error due to the thermal expansion of the support member can be suppressed. Moreover, even if the surface of the stage apparatus is damaged, since the surface does not protrude, an air pad such as a non-contact bearing or the like is not damaged. Hence high planar precision is maintained so that planar travel characteristics of the movable stage can be maintained for a long period of time. Moreover, since the ceramics are a non-magnetic material, when a magnetic bearing is used as a non-contact bearing, the ceramics do not adversely affect the magnetic bearing.

Furthermore, the holder of the present invention is a holder for holding a substrate, having a plurality of protruding members arranged at approximately even spacing for supporting the substrate, and the plurality of protruding members consist of ceramics having a coefficient of thermal expansion of $1 \times 10^{-6}/°$ C. or less.

Accordingly, with the holder of the present invention, even if heat is applied to the protruding members via the substrate due to the exposure processing or the like, a temperature change of up to about 0.007° C. can be allowed in order to suppress a difference in the thermal expansion occurring in the substrate having, for example, a radius of 150 mm, so as to be not larger than 1 nm. Furthermore, with this holder, the effect is obtained in that even if heat is transmitted from the substrate, thermal expansion can be suppressed, and stress applied to the substrate can be reduced.

A holder in an other embodiment of the present invention is constructed such that the coefficient of thermal expansion of the protruding members is $0.5 \times 10^{-6}/°$ C. or less. With this holder, the effect is obtained in that thermal expansion can be further suppressed, and stress applied to the substrate can be further reduced. Moreover, temperature change of up to about 0.013° C. can be allowed in order to suppress a difference in the thermal expansion occurring in a substrate having a radius of 150 nm, so as to be not larger than 1 nm. Therefore the degree of dependence on temperature control can be greatly reduced.

A holder in an other embodiment of the present invention is constructed such that the protruding members are surface-treated with silicon carbide (SiC). With this holder, the effects is obtained in that electroconductivity is improved, thereby enabling countermeasures against static electricity to be effected. Furthermore, the surface becomes dense thereby increasing the strength.

Moreover, the scanning exposure apparatus of the present invention is a scanning exposure apparatus for exposing a pattern on a substrate while a stage is moving, and comprises: a holder for holding the substrate, and a position detection device for detecting a position of the substrate, based on reflected light from a mobile mirror provided at a predetermined positional relationship with the holder, and the holder and a base material of the mobile mirror consist of ceramics having a coefficient of thermal expansion of $1 \times 10^{-6}/°$ C. or less.

Therefore, with the scanning exposure apparatus of the present invention, if the substrate and the mobile mirror are arranged at a distance of for example 200 mm, a variation in the atmosphere temperature of up to about 0.005° C. can be allowed in order to ensure a positioning error of not larger than 1 nm due to temperature change. Accordingly, the degree of dependence on temperature control is reduced, enabling a reduction in costs. As a ceramics having such a low thermal expansion, a cordierite type ceramics is preferable. A cordierite type ceramics consist generally of a composition of $2MgO\text{-}2Al_2O_3\text{-}5SiO_2$, and is obtained by blending respective metal oxides at a predetermined ratio, molding these to a predetermined shape, and sintering in an oxidizing atmosphere at 1300 to 1550° C. Moreover, with the scanning exposure apparatus, when a predetermined positioning precision is maintained, the effect is obtained in that it becomes possible to alleviate the degree of dependence on temperature control, enabling costs associated with temperature control to be reduced.

A scanning exposure apparatus in another embodiment of the present invention is constructed such that the holder and a base material of the mobile mirror consist of ceramics having a coefficient of thermal expansion of $0.5 \times 10^{-6}/°$ C. or less. With this scanning exposure apparatus, a variation in the atmosphere temperature of up to about 0.01° C. can be allowed. Hence the effect is obtained in that the degree of dependence on temperature control can be further alleviated and costs associated with temperature control can be greatly reduced.

A scanning exposure apparatus in an other embodiment of the present invention is constructed such that the stage is a substrate stage for moving the substrate via the holder. With this scanning exposure apparatus, the effect is obtained in that also when positioning precision is maintained relative to the substrate on which a pattern is exposed, it becomes possible to alleviate the degree of dependence on temperature control, enabling a reduction in costs associated with temperature control.

A scanning exposure apparatus in an other embodiment of the present invention is constructed such that a plurality of the substrate stages are provided. With this scanning exposure apparatus, the effect is obtained in that throughput can be greatly improved by implementing the exposure operation while executing the substrate replacement and alignment operation.

A scanning exposure apparatus in an other embodiment of the present invention is constructed such that the stage is a mask stage for moving a mask. With this scanning exposure apparatus, the effect is obtained in that also when positioning precision is maintained relative to the mask on which a pattern is formed, it becomes possible to alleviate the degree of dependence on temperature control, enabling a reduction in costs associated with temperature control.

A scanning exposure apparatus in an other embodiment of the present invention is constructed such that the mask stage moves, holding a plurality of masks. With this scanning exposure apparatus, the effect is obtained in that even if the distance between the mask and the mobile mirror increases, it becomes possible to alleviate the degree of dependence on temperature control when positioning precision is maintained, enabling a reduction in costs associated with temperature control.

An exposure apparatus of the present invention is an exposure apparatus for exposing a pattern on a substrate, and is characterized in that the substrate is held by a holder having a plurality of protruding members arranged at approximately equal spacing, and the plurality of protruding members consist of ceramics having a coefficient of thermal expansion of $1 \times 10^6/°$ C. or less.

Accordingly, with the exposure apparatus of the present invention, even if heat is applied to the protruding members via the substrate due to the exposure processing or the like, a temperature change of up to about 0.007° C. can be allowed in order to suppress a difference in the thermal expansion occurring in the substrate having, for example, a radius of 150 nm, so as to be not larger than 1 nm. Furthermore, with this exposure apparatus, the effect is obtained in that even if heat is transmitted from the substrate, it becomes possible to suppress the variation in the expansion length between a plurality of shot areas on the substrate, by reducing the stress applied to the substrate. Hence deterioration of superposition precision can be prevented beforehand.

An exposure apparatus in an other embodiment of the present invention is constructed such that the coefficient of thermal expansion of the protruding members is $0.5 \times 10^{-6}/°$ C. or less. With this exposure apparatus, the effect is obtained in that a temperature change of up to 0.013° C. can be allowed, enabling a significant reduction in the degree of dependence on temperature control. Moreover, the stress applied to the substrate can be further reduced, enabling effective prevention of deterioration in the superposition precision.

An exposure apparatus in an other embodiment of the present invention is constructed such that the protruding members are surface-treated with silicon carbide (SiC). With this exposure apparatus, the effects is obtained in that electroconductivity is improved, thereby enabling countermeasures against static electricity to be effected. Moreover, the surface becomes dense thereby increasing the strength.

DESCRIPTION OF THE PREFERRED EMBODIMENTS

Below is a description of embodiments of a stage apparatus and holder, and scanning exposure apparatus and exposure apparatus of the present invention, with reference to FIG. 1 to FIG. 4. Here, the description uses an example of a case where a scanning exposure apparatus (scanning stepper) which moves a reticle and a wafer simultaneously to transfer a circuit pattern of a semiconductor device formed on the reticle onto the wafer, is used as an exposure apparatus. Moreover, with the exposure apparatus, it is assumed that the stage apparatus of the present invention is applied to both the reticle stage and the wafer stage.

Figure 1:
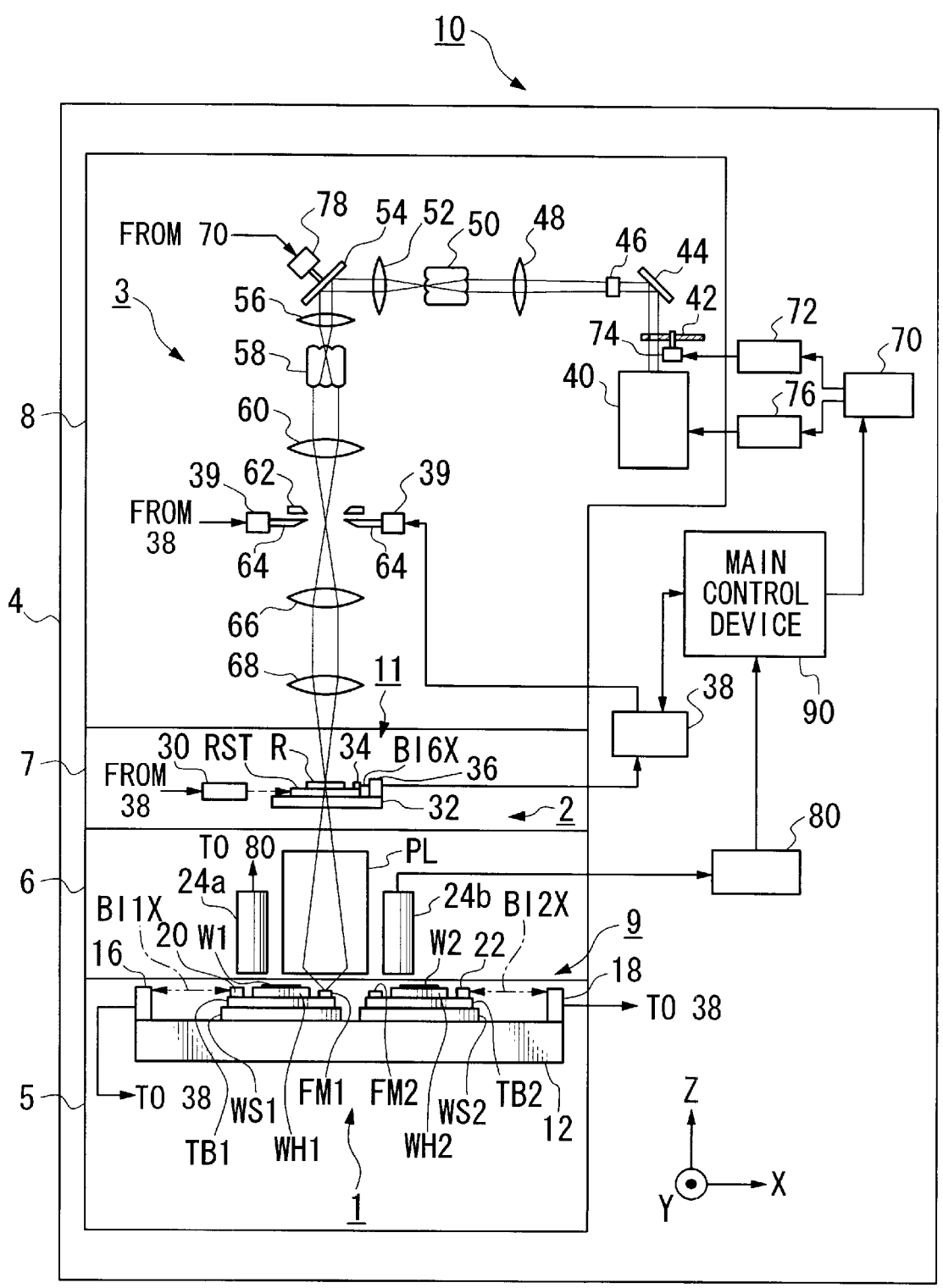
FIG. 1 is a diagram showing an embodiment of the present invention, being a schematic block diagram of a projection exposure apparatus.

FIG. 1 shows a schematic construction of a projection exposure apparatus 10 according to one embodiment. The projection exposure apparatus 10 is a scanning exposure type projection exposure apparatus of a so-called step and scan type.

The projection exposure apparatus 10 comprises: a stage apparatus 1 comprising wafer stages (movable stages) WS1 and WS2 serving as first and second substrate stages independently moving in the two-dimensional direction and respectively holding wafers W1 and W2 as substrates (sensitive substrates) on a surface plate (support member) 12; a projection optical system PL disposed above the stage apparatus 1; a stage apparatus 2 above the projection optical system PL, comprising a reticle stage (mask stage, movable stage) RST which drives a reticle R serving as a mask in a predetermined scanning direction as a principal direction, being in this case the Y axis direction (in the direction orthogonal to the page in FIG. 1); an illumination system 3 for illuminating the reticle R from above; and a control system for controlling these respective parts. These are all contained in a chamber 4 in which the temperature and humidity are controlled.

Moreover, the inside of the chamber 4 is further divided into chambers 5 to 8. The respective chambers 5 to 8 contain the stage apparatus 1, the projection optical system PL, the stage apparatus 2 and the illumination system 3, respectively. In the chamber 4, the temperature is controlled so as to be within a range of ±0.1° C. relative to a set temperature of 23° C. Moreover, in the chambers 5 to 7, the temperature is controlled so as to be within a range of ±0.005° C. relative to the set temperature of 23° C., and in the chamber 8, the temperature is controlled so as to be within a range of ±0.1° C. relative to the set temperature of 23° C., as in the chamber 4. As a method of controlling the temperature, for example, a method is adopted where a gas which is inert with respect to the photochemical reaction, is circulated in each chamber in a temperature controlled condition. Moreover, partitions between chambers are provided with transparent windows (not shown) located on the optical path of the exposure light, so that the exposure light can pass through the windows without any problem.

The stage apparatus 1 is floated and supported via an unillustrated non-contact bearing (for example, an air bearing) on the surface plate 12, and comprises the two wafer stages WS1 and WS2, independently movable in the two-dimensional direction, i.e., in the X axis direction (in the left and right direction on the page in FIG. 1) and the Y axis direction (in the direction orthogonal to the page in FIG. 1) by means of a linear motor or the like; a stage drive system (not shown) for driving these wafer stages WS1 and WS2; and an interferometer system (position detection device) 9 for measuring the position of wafers W1 and W2 via the wafer stages WS1 and WS2. The stage drive system is controlled by a control apparatus 38.

To described in more detail, there are provided unillustrated air pads (for example, vacuum preload type air bearings) in a plurality of places on the bottom face of the wafer stages WS1 and WS2, and the wafer stages WS1 and WS2 are floated and supported on the surface plate 12 in a condition with a gap of for example several microns, by balancing between an air jet force of the air pad and a vacuum preload force. The upper face of the surface plate 12 is coated with ceramics, which will be described later.

Figure 2:
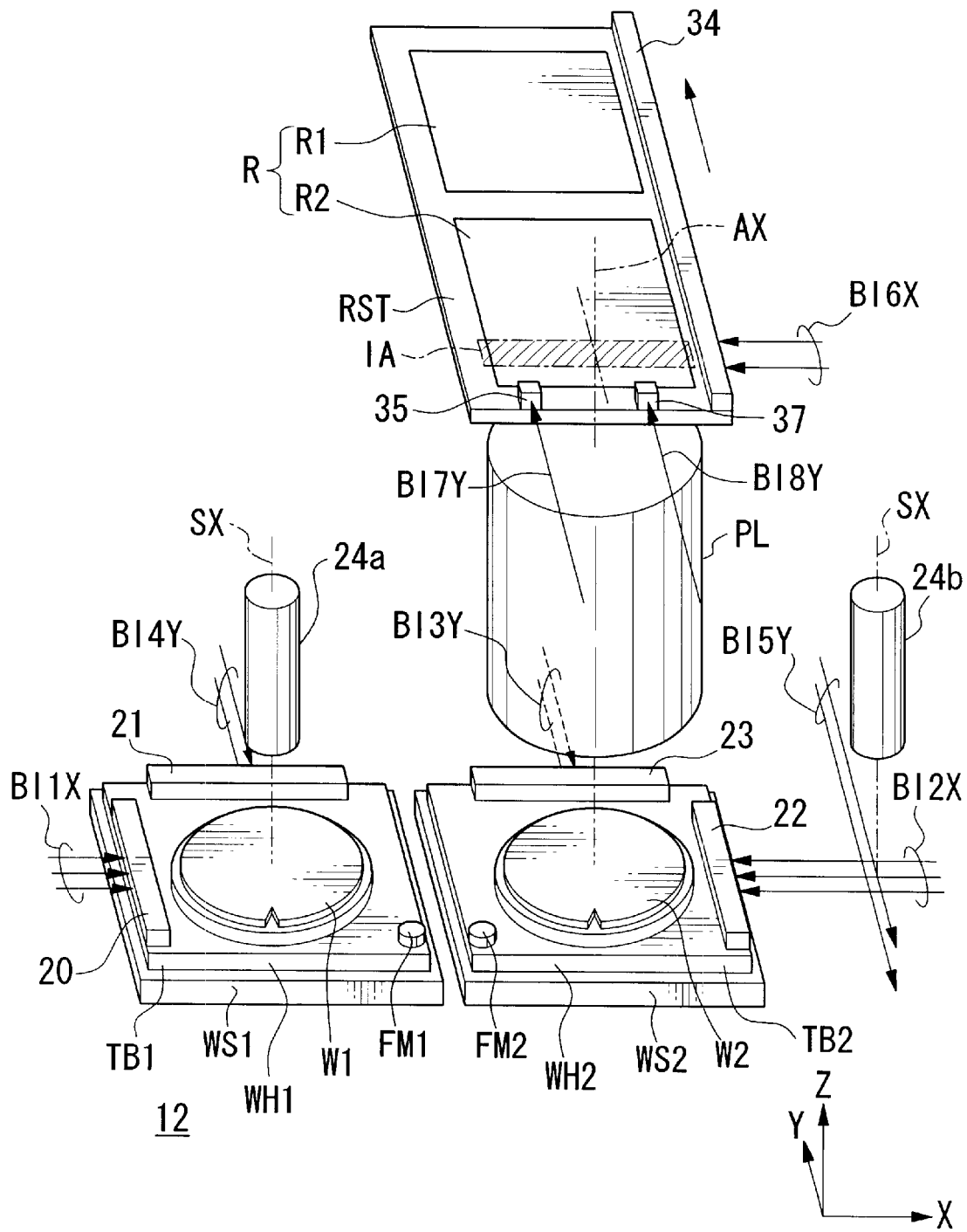
FIG. 2 is an external perspective view showing the positional relationship of two wafer stages, a reticle stage, a projection optical system and an alignment system.
Figure 3A:
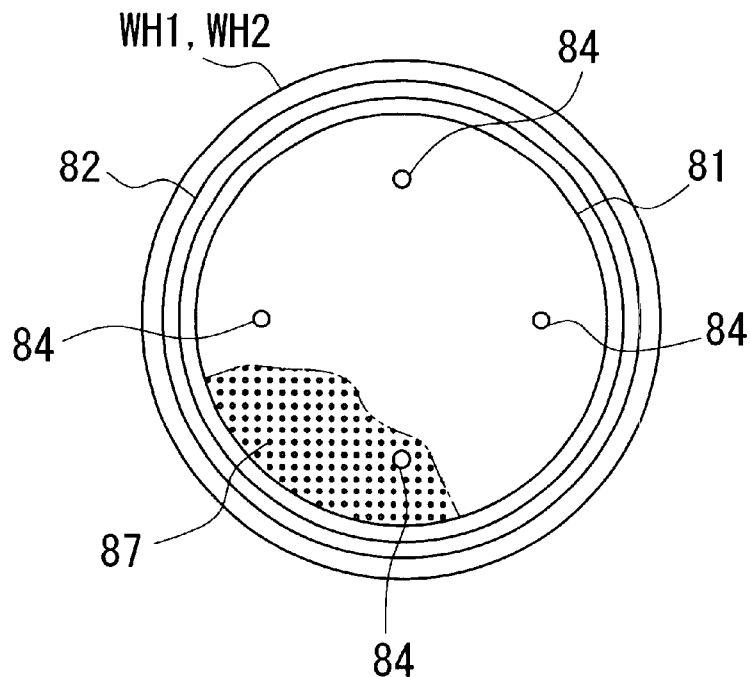
FIG. 3A is a plan view of a wafer holder in the scanning exposure apparatus of the present invention.
Figure 3B:
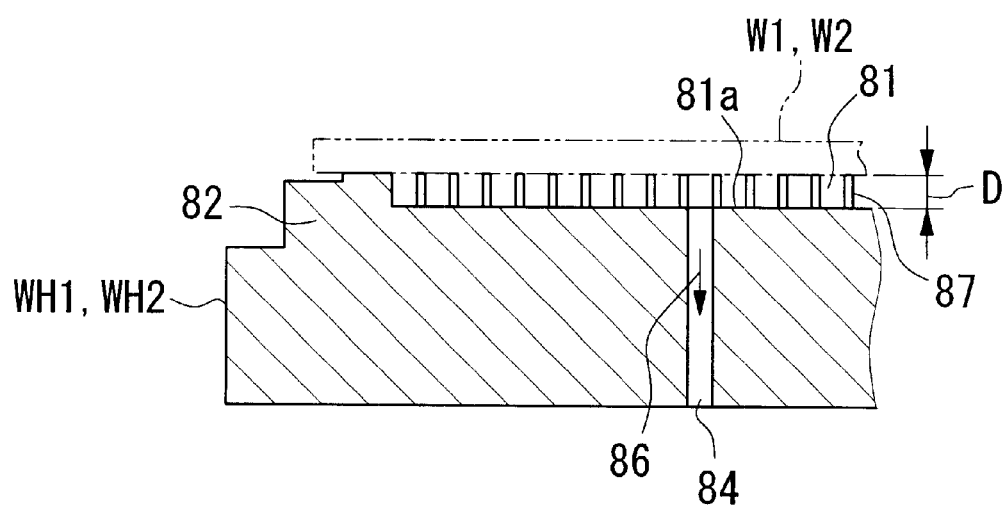
FIG. 3B is an enlarged sectional view of the main part of the wafer holder.

As shown in FIG. 2, on the wafer stages WS1 and WS2, there are respectively provided tables (bases) TB1 and TB2 for moving in the optical axis direction (in the Z direction) for adjusting the focal position and performing leveling adjustment. These are driven minutely in the Z axis direction orthogonal to the XY plane and in the θ direction (in the direction of rotation around the Z axis) by an unillustrated Z/θ drive mechanism. On the tables TB1 and TB2, there are mounted wafer holders (holders) WH1, WH2 for attracting and holding the respective wafers W1 and W2. These are detachably by vacuum attachment or kinematic coupling or the like. As shown in FIG. 3A and FIG. 3B, the wafer holders WH1, WH2 are formed in a disc form, and are provided with a circular vacuum attachment portion 81 formed by a concave portion in the center on the upper surface, in which a plurality of minute protrusions (protruding members) 87 are arranged approximately equally at a certain spacing, and a seal portion 82 outside of the vacuum attachment portion 81. The seal portion 82 is formed by an annular protrusion surrounding the vacuum attachment portion 81. Also, within the wafer holders WH1, WH2, there is formed four vacuum discharge holes 84. One end of the vacuum discharge hole 84 opens to the inner bottom face 81a of the vacuum attachment portion 81, and the other end thereof opens to the lower face of the wafer holders WH1 and WH2, and is connected to an unillustrated vacuum pump. In FIG. 3B, the protrusions 87 are shown only partly, but these protrusions 87 are provided over the whole face of the vacuum attachment portion 81 and inside the seal portion 82. The depth D of the vacuum attachment portion 81, in other words, the height of the protrusions 87 is from about 100 μm to 1 mm. The protrusions 87 are formed in a thin pin form, and the upper face thereof forms a high-precision plane. The height of the seal portion 82 (the height of the vacuum attachment portion 81 from the inner bottom face 81a) is set to be identical to that of the protrusion 87. Furthermore, the outer peripheral side of the seal portion 82 is a stepped portion which is lower than the seal face and of a smaller diameter than the outer diameter of the wafers W1, W2. These protrusions 87 may have an appropriate cross-section such as a circle, a square or the like. In order to reduce the contact area with the wafers W1, W2, the protrusions are formed as thin as possible, and are provided at a spacing such that at the time of vacuum attachment, the wafer does not flex, depending upon the thickness of the wafer.

With such a structure, the wafers W1 and W2 are mounted on the wafer holders WH1 and WH2, and when air 86 in the vacuum discharge holes 84 and the vacuum attachment portion 81 is discharged by a vacuum pump, the air 86 flows in the direction shown by the arrow, and the wafer and the seal portion 82 are adhered tightly to each other, with the vacuum attachment portion 81 at a negative pressure. Therefore, the wafers W1, W2 are pressed against the upper face of the protrusions 87, and bowing or bending of the wafer is corrected. Moreover, even if part of the resist applied to the upper face of the wafers W1 and W2 drops from the end rim of the wafer onto the seal portion 82, the resist can be prevented from getting onto the seal face, due to the existence of the stepped portion. In addition, the wafer holders WH1, WH2 are also formed of ceramics, which will be described later. On the upper faces of the tables TB1 and TB2, there are respectively installed reference mark plates FM1 and FM2, on which are formed various reference marks, these reference mark plates having approximately the same height as that of the wafers W1, W2. These reference mark plates FM1 and FM2 are used when the reference position of, for example, each wafer stage WS1, WS2 is detected. The interferometer system 9 comprises: mobile mirrors 20, 21 held by the table TB1 common to the wafer holder WH1 and provided in a predetermined positional relationship with the wafer holder WH1; mobile mirrors 22, 23 held by the table TB2 common to the wafer holder WH2 and provided in a predetermined positional relationship with the wafer holder WH2; an interferometer 16 as shown in FIG. 1 for irradiating interferometric beams shown by a length measuring axis BI1X; an interferometer 18 for irradiating interferometric beams shown by a length measuring axis BI2X; and interferometers (not shown) for irradiating interferometric beams shown by length measuring axes BI3Y to BI5Y, respectively. With this embodiment the outer diameter of the wafers W1, W2 is about 300 mm, and the wafers are respectively set to give a positional relationship such that the distance from the center of the wafers, that is, the center of the wafer holders WH1, WH2 to the mobile mirrors 20, 21 and 22, 23 is about 200 mm.

The mobile mirror 20 is provided extending in the Y axis direction at an end rim on the −X side on the table TB1. The face on the −X side is made by subjecting a base material of ceramics to aluminum vapor deposition to become a reflecting surface for reflecting the interferometric beams irradiated from the interferometer 16. The mobile mirror 22 is provided extending in the Y axis direction at an end rim on the +X side on the table TB2. The face on the +X side is also made by subjecting a base material of ceramics to aluminum vapor deposition to become a reflecting surface for reflecting the interferometric beams irradiated from the interferometer 18. The interferometers 16 and 18 receive the reflected light from the mobile mirrors 20, 22, respectively, to thereby measure the relative displacement from the reference position on each reflecting surface, and to measure the position in the X axis direction of the wafer stages WS1, WS2 (and in its turn, wafers W1, W2). Here, the interferometers 16 and 18 are, as shown in FIG. 2, three axis interferometers each having three optical axes, and are thus able to perform tilt measurement and θ measurement, in addition to the measurement of the wafer stages WS1, WS2 in the X axis direction. The output value of each optical axis can be independently measured. The tables vapor TB1, TB2 that perform θ rotation of the wafer stages WS1, WS2, minute driving in the Z axis direction and tilt driving, are located below the reflecting surface. Hence the drive amounts at the time of controlling the tilt of the wafer stages can all be monitored by these interferometers 16, 18.

Similarly, the mobile mirror 21 is provided extending in the X axis direction at an end rim on the +Y side on the table TB1, and the mobile mirror 23 is provided extending in the X axis direction at an end rim on the +Y si de on the t able TB2. The respective faces on the +Y side are made by subjecting a base material of ceramics to aluminum vapor deposition to become reflecting surfaces for reflecting the interferometric beams irradiated from the interferometers having length measuring axes BI3Y to BI5Y Here, the length measuring axis BI3Y perpendicularly crosses the X axis at the projection center of the projection optical system PL, and the length measuring axes BI4Y and BI5Y perpendicularly cross the X axis at the detection center of the alignment systems 24a and 24b, respectively.

In the case of this embodiment, a measurement value of the interferometer on the length measuring axis BI3Y passing through the projection center of the projection optical system, that is, the optical axis AX is used for the measurement of the position of the wafer stages WS1, WS2 in the Y direction, at the time of exposure using the projection optical system PL. A measurement value of the interferometer on the length measuring axis BI4Y passing through the detection center of the alignment system 24a, that is, the optical axis SX is used for the measurement of the position of the wafer stage WS1 in the Y direction at the time of using the alignment system 24a, and a measurement value of the interferometer on the length measuring axis BI5Y passing through the detection center of the alignment system 24b, that is, the optical axis SX is used for the measurement of the position of the wafer stage WS2 in the Y direction at the time of using the alignment system 24b. The respective interferometers on the length measuring axes BI3Y, BI4Y and BI5Y are two-axis interferometers each having two optical axes, and are thus able to perform tilt measurement, in addition to the measurement of the wafer stages WS1, WS2 in the Y axis direction. The output value of each optical axis can be independently measured.

Moreover, with this embodiment, as described above, while one of the wafer stages WS1 and WS2 is executing the exposure sequence, the other is executing the wafer replacement/wafer alignment sequence. At this time, the movement of wafer stages WS1 and WS2 is controlled by the stage control apparatus 38 in accordance with instructions from the main control apparatus 90, based on the output value of the respective interferometers.

With the stage apparatus 1 of this embodiment, the wafer holders WH1 and WH2, the base material of the mobile mirrors 20 to 23, the tables TB1 and TB2, and the wafer stages WS1 and WS2 consist of ceramics having a low thermal expansion. The surface plate 12 is made of stone with the upper surface of the body coated with ceramics. In addition, instead of the mobile mirrors 20 to 23, the end faces of the tables TB1 and TB2 may be subjected to aluminum vapor deposition to thereby form a reflecting surface. By making the end faces of the tables TB1 and TB2 reflecting surfaces, the wafer stages WS1 and WS2 can be made light weight.

As the ceramics having low thermal expansion, a cordierite type ceramics is preferable. A cordierite type ceramics consist generally of a composition of $2MgO\text{-}2Al_2O_3\text{-}5SiO_2$, and is obtained by blending respective metal oxides at a predetermined ratio (or without additives), molding these to a predetermined shape, and sintering in an oxidizing atmosphere at 1300 to 1550° C. The cordierite type ceramics has a coefficient of thermal expansion of $0.1 \times 10^{-6}/°$ C., in the case of having no additives, and by adding at least one kind of Y (yttrium) or rare earth elements (for example, Er, Yb, Sm, Lu, Ce) to cordierite at a rate of 3 to 15% by weight based on oxides, the cordierite type ceramics shows a coefficient of thermal expansion of $1.0 \times 10^{-6}/°$ C. or less, and a high Young's modulus.

Considering that when leveling is performed, or with the stress on the table at the time of movement, the distance between the wafer holder and the mobile mirror may be changed, it is preferable to set the Young's modulus of the cordierite type ceramics higher, and for example, 215 GPa or higher which is the same level as steel is preferable. In this case, this can be realized by adding a suitable quantity of $Yb_2O_3$ and $Si_3N_4$ (or SiC) to cordierite.

On the other hand, the surface plate 12 is formed of stone having a sufficient rigidity such as Indian Black which has a coefficient of thermal expansion of approximately the same as that of steel materials, and the upper face thereof is coated with ceramics by thermal spraying or the like. As the ceramics, the above described cordierite may be selected, but alumina ceramics (gray alumina, alumina titania or the like), silicon nitride, tungsten carbide, titania, chromium oxide (chromia) or the like is also applicable.

Moreover, with regard to the wafer holders WH1 and WH2, by coating the protrusions 87 (surface treated) with SiC (silicon carbide), the electroconductivity is improved, and the surface becomes dense thereby increasing the strength.

As the above described projection optical system PL, a dioptric system comprising a plurality of lens elements having a common optical axis in the Z direction, and having a predetermined reduction magnification of, for example, ¼ with both sides being telecentric is used herein. Therefore, the moving speed of the wafer stage in the scanning direction, at the time of scanning exposure by the step and scan method, becomes ¼ of the moving speed of the reticle stage. Each lens element is held by a holding member (not shown) having the same level of coefficient of thermal expansion, and the holding members are supported by a body tube having an extremely small coefficient of thermal expansion (for example, 0.02 ppm/K).

On the opposite sides in the X axis direction of the projection optical system PL, as shown in FIG. 1, there are arranged off-axis type alignment systems 24a and 24b having the same function, at respective positions the same distance away from the center of the optical axis of the projection optical system PL (coinciding with the projection center of the reticle pattern image). These alignment systems 24a and 24b have three kinds of alignment sensors, that is, LSA (Laser Step Alignment) type, FIA (Filed Image Alignment) type, and LIA (Laser Interferometric Alignment) type, and are capable of measuring the position of the reference marks on the reference mark plates FM1 and FM2 and the alignment marks on the wafers W1 and W2 in the X, Y two dimensional direction.

The information from the respective alignment sensors constituting these alignment systems 24a and 24b is A/D converted by an alignment control apparatus 80, and the digitized waveform signals are subjected to arithmetic processing to thereby detect the mark positions. The results are sent to the main control apparatus 90, and based on the results, synchronous position correction or the like at the time of exposure is instructed from the main control apparatus 90 to the stage control apparatus 38.

Moreover, with the exposure apparatus 10 in this embodiment, while not shown in FIG. 1, a pair of reticle alignment microscopes comprising a TTR (Through The Reticle) alignment optical system which uses an exposure wavelength for performing simultaneous observation of the reticle marks (not shown) on the reticle R and marks on the reference mark plates FM1 and FM2, are provided above the reticle R. Detection signals from these reticle alignment microscopes are supplied to the main control apparatus 90. A construction the same as that of the reticle alignment microscopes is disclosed for example in Japanese Unexamined Patent Application, First Publication No. Hei 7-176468.

Next is a description of the stage apparatus 2. The stage apparatus 2 comprises: a reticle stage RST which holds a reticle as the substrate on a reticle plate 32 and is movable in the X, Y two dimensional directions; a linear motor (not shown) for driving the reticle stage RST; and a reticle interferometer system (position detection device) 11 for controlling the position of the reticle stage RST.

As shown in FIG. 2, on the reticle stage RST, two (a plurality of) reticles R1 and R2 are set up in series in the scanning direction (in the Y axis direction). The reticle stage RST is floated and supported on the reticle plate 32 via an air bearing or the like (not shown), and minute driving in the X axis direction, minute rotation in the θ direction, and scanning driving in the Y axis direction are performed by a drive mechanism 30 (see FIG. 1) comprising a linear motor or the like (not shown).

Moreover, the drive mechanism 30 is a mechanism using a linear motor similar to that of the above described stage apparatus 1 as a drive source. In FIG. 1 however, this is shown as a block for the convenience of illustration and explanation. Therefore, the reticle stage 2 is constructed such that reticles R1 and R2 on the reticle stage RST are selectively used at the time of, for example, double exposure, and either reticle can be scanned synchronously with the wafer side.

On the reticle stage RST, though not shown, a reticle holder (holder) for attracting and holding the outside of the pattern area of the reticle R is supported. Moreover, a mobile mirror 34 is extended in the Y axis direction, located at the end portion on the +X side, and two mobile mirrors 35, 37 are arranged, located at the end portion on the −Y side. Here, reticles having a size of 152.4 mm (6 inches) are arranged with a space in the Y direction. The base materials of the reticle stage RST, reticle holder and mobile mirrors 34, 35 and 37 comprise a cordierite type ceramics having a low thermal expansion, as for the above described stage apparatus 1, and the coefficient of thermal expansion is set to be $1.0 \times 10^{-6}/°$ C. or less. Moreover, the upper face of the reticle plate 32 is coated with ceramics, as with the surface plate 12. In addition, instead of the mobile mirrors 34, 35 and 37, the end faces of the reticle stage RST may be subjected to aluminum vapor deposition to thereby form a reflecting surface. By making the end faces of the reticle stage RST reflecting surfaces, the reticle stage RST can be made light weight.

The surface on the +X side of the mobile mirror 34 and the surface on the −Y side of the mobile mirrors 35 and 37 are subjected to aluminum vapor deposition to thereby form a reflecting surface. Interferometric beams are irradiated from the interferometer 36 toward the reflecting surface of the mobile mirror 34, as shown by the length measuring axis BI6X. The interferometer 36 receives the reflected light, and measures the relative displacement relative to the reference face, as on the wafer stage side, to thereby measure the position in the X direction of the reticle stage RST. Here, the interferometer having the length measuring axis BI6X has actually two interferometric optical axes, enabling independent measurement. Hence, the position measurement of the reticle stage RST in the X axis direction and the measurement of the yaw amount is possible.

Interferometric beams are irradiated from a pair of not shown double path interferometers shown by the length measuring axes BI7Y and BI8Y, toward the mobile mirrors 35 and 37, and the respective reflected beams reflected by the mobile mirrors 35 and 37 are received by the respective double path interferometers. The measurement values of these double path interferometers are then supplied to the stage control apparatus 38 in FIG. 1, and based on the averaged value thereof, the position of the reticle stage RST in the Y axis direction is measured. The information regarding the position in the Y axis direction is used for calculation of the relative position of the reticle stage RST and the wafer stage WS1 or WS2 based on the measurement value of the interferometer having the length measuring axis BI3Y on the wafer side, and for synchronous control of the reticle and the wafer in the scanning direction (in the Y axis direction)

based on the calculation, at the time of scanning exposure. That is to say, with this embodiment, the reticle interferometer system 11 is constituted by the mobile mirrors 34, 35 and 37, the interferometer 36, and the pair of double path interferometers shown by the length measuring axes BI7Y and BI8Y.

Next is a description of the illumination system 3, with reference to FIG. 1. As shown in FIG. 1, this illumination system 3 comprises a light source section 40, a shutter 42, a mirror 44, beam expanders 46 and 48, a first fly-eye lens 50, a lens 52, a vibrating mirror 54, a lens 56, a second fly-eye lens 58, a lens 60, a fixed blind 62, a movable blind 64, relay lenses 66 and 68, and the like.

Here, the respective portions in the above described construction of the illumination system 3 will be described together with the operation thereof.

The laser beam emitted from the light source section 40 comprising a KrF excimer laser serving as a light source and a dimming system (a dimming plate, an aperture stop or the like), is deflected by the mirror 44, after having passed through the shutter 42, and shaped so as to have a suitable beam diameter by the beam expanders 46 and 48, to enter the first fly-eye lens 50. The incident beam into the first fly-eye lens 50 is divided into a plurality of beams by the elements of the fly-eye lens arranged two-dimensionally, to enter the second fly-eye lens 58 through the lens 52, the vibrating mirror 54 and the lens 56, with the incident angle being different for each beam. The beam emitted from the second fly-eye lens 58 reaches the fixed blind 62 installed at a conjugational position relative to the reticle R through the lens 60. After the cross-section is defined into a predetermined shape, the beam passes through the movable blind 64 disposed at a slightly defocused position from the conjugational face of the reticle R, and through the relay lenses 66, 68 to thereby illuminate the illumination area IA (see FIG. 2) on the reticle R, in a predetermined shape defined by the above described fixed blind 62 (here in a shape of a rectangular slit), as uniform illumination light.

Next is a description of the control system, with reference to FIG. 1. This control system is centered on the main control apparatus 90 that controls the whole apparatus supervisingly, and comprises an exposure quantity control apparatus 70 and the stage control apparatus 38 which are under supervision of the main control apparatus 90.

The operation of the projection exposure apparatus 10 according to this embodiment at the time of exposure will now be described, focusing on the operation of respective portions in the above construction of the control system.

The exposure quantity control apparatus 70 instructs the shutter drive apparatus 72 to drive the shutter drive section 74 to thereby open the shutter 42, prior to starting the synchronous scanning of the reticle R and the wafer (W1 or W2).

Thereafter, by the stage control apparatus 38, the synchronous scanning (scan control) of the reticle R and the wafer (W1 or W2), that is, the reticle stage RST and the wafer stage (WS1 or WS2) is initiated, in response to the instruction of the main control apparatus 90. The synchronous scanning is performed by controlling respective linear motors which constitute the reticle drive section 30 and the drive system of the wafer stage, by the stage control apparatus 38, while monitoring the measurement value of the length measuring axis BI3Y and the length measuring axis BI1X or BI2X of the aforementioned interferometer system, or the length measuring axes BI7X and BI8Y and the length measuring axis BI6X of the reticle interferometer system.

Then, at the point in time when the both stages are controlled to a constant velocity within a predetermined allowable error, the exposure quantity control apparatus 70 instructs to the laser control apparatus 76 to initiate pulse emission. Thereby, the aforesaid rectangular illumination area IA on the reticle R, on the lower face of which a pattern is chromium vapor deposited, is illuminated with the illumination light from the illumination system 3, and the pattern image within the illumination area is reduced to ¼ magnification by the projection optical system PL, and is projected and exposed onto the wafer (W1 or W2), on the surface of which a photoresist is applied. Here, as is obvious from FIG. 2, the slit width of the illumination area IA in the scanning direction is narrower than the pattern area on the reticle, and by performing synchronous scanning of the reticle R and the wafer (W1 or W2) as described above, the whole image of the pattern is sequentially formed on the shot area on the wafer.

The parallel processing by means of the two wafer stages WS1 and WS2 will now be described. With this embodiment, while exposure operation on the wafer W2 on the wafer stage WS2 is performed via the projection optical system PL, the wafer is replaced in the wafer stage WS1, and subsequent to the wafer replacement, alignment operation and auto focus/auto leveling are performed. The positional control of the wafer stage WS2 during the exposure operation is performed based on the measurement value of the length measuring axes BI2X and BI3Y of the interferometer system. The. positional control of the wafer stage WS1 where the wafer replacement and the alignment operation are performed, is conducted based on the measurement value of the length measuring axes BI1X and BI4Y.

While the above described wafer replacement and alignment operation are performed on the wafer stage WS1 side, on the wafer stage WS2 side, double exposure is performed by the step and scan method, using two reticles R1 and R2, while changing the exposure conditions. With regard to the exposure sequence and the wafer replacement/alignment sequence performed in parallel on the two wafer stages WS1 and WS2, the wafer stage whose operation has been completed first is in a waiting state, and when both operations have been finished, the wafer stages WS1 and WS2 are moved and controlled. Then, the wafer W2 on the wafer stage WS2 whose exposure sequence has been completed is subjected to the wafer replacement at the loading position, and the wafer W1 on the wafer stage WS1 whose alignment sequence has been completed is subjected to the exposure sequence under the projection optical system PL.

As described above, while the wafer replacement and alignment operation is carried out on one wafer stage, the exposure operation is performed on the other wafer stage, and when both operations are finished, the operations are changed over to each other. Hence it becomes possible to greatly improve the throughput.

With the stage apparatus and holder, and scanning exposure apparatus and exposure apparatus in this embodiment, since of the wafer holders WH1, WH2 having protrusions 87 and mobile mirrors 20 to 23 are formed of ceramics having a coefficient of thermal expansion of $0.1 \times 10^{-6}/°$ C. or less, a variation in the atmosphere temperature of up to about 0.005° C. can be allowed in order to ensure a positioning precision of not more than 1 nm between the wafer holder and the mobile mirror. Accordingly, the degree of dependence on temperature control is reduced, enabling a reduction in costs. On the other hand, with a single wafer holder, a variation in the atmosphere temperature of up to about 0.007° C. can be allowed in order to ensure a positioning precision of not more than 1 nm relative to a wafer having a radius of 150 nm.

Moreover, by using ceramics or the like obtained by adding $Yb_2O_3$ or $Y_2O_3$ in an amount of not more than 10% by weight with respect to cordierite, the coefficient of thermal expansion becomes $0.5 \times 10^{-6}/°$ C. or less, enabling allowance of a variation in the atmosphere temperature within the chamber of up to about 0.01° C. (with a single wafer holder, 0.013° C.). Hence it becomes possible to further reduce the cost associated with the temperature control.

In particular, for example by adding 3% by weight of $Yb_2O_3$ and 10 to 20% by weight of $Si_3N_4$ with respect to cordierite, such characteristics are shown that the coefficient of thermal expansion is $0.5 \times 10^{-6}/°$ C. or less and the Young's modulus is about 220 Gpa which is higher than steel materials. Hence, not only the positioning error resulting from the thermal expansion, but also positioning error resulting from stresses acting on the wafer holder and tables accompanied by leveling and stage movement can be reduced, enabling realization of positioning at higher precision.

Furthermore, with this embodiment, since the wafers W1 and W2 are supported by minute protrusions 87 in the wafer holders WH1 and WH2, and the protrusions 87 are formed of ceramics having a coefficient of thermal expansion of $1.0 \times 10^{-6}/°$ C. or less, then even if heat is transmitted to the protrusions 87 from the wafers W1 and W2 during the exposure processing, thermal expansion of the holder can be suppressed. Therefore, stresses acting on the substrate as well as thermal expansion is reduced, and it becomes possible to suppress the variation in the expansion length between a plurality of shot areas on the wafers W1 and W2, thus enabling prevention beforehand of a decrease in the superposition precision. Moreover, with this embodiment, since SiC coating is applied on the protrusions 87, the electroconductivity is improved, thereby enabling countermeasures against static electricity to be effected. Moreover, the surface becomes dense thereby increasing the strength.

Also, with this embodiment, since the tables for holding the wafer holder and the mobile mirrors are formed of ceramics having a low thermal expansion, then even if thermal expansion occurs due to the temperature change, stresses resulting from differences in expansion length do not occur, enabling removal of a factor causing positioning error. In addition, since the wafer stages WS1 and WS2 for supporting the tables are also formed of ceramics, differences in thermal expansion lengths between the tables and the wafer stages can be reduced to thereby suppress stress production.

Moreover, with this embodiment, since the surface of the surface plate 12 is coated with ceramics, and even if the surface is damaged, the surface does not protrude, abrasion is not caused between the air pad and the surface. Hence an air pad such as a non-contact type bearing or the like is not damaged, and high planar precision can be maintained, enabling maintenance of planar travel characteristics of the wafer stages WS1 and WS2 for a long period of time. Furthermore, since the ceramics are a non-magnetic material, when a magnetic bearing is used as the non-contact bearing, the ceramics do not adversely affect the magnetic bearing, which is thus preferable.

On the other hand, with this embodiment, in the stage apparatus 2, the reticle holder and the mobile mirrors 34, 35 and 37 are formed of ceramics having a coefficient of thermal expansion of $1.0 \times 10^{-6°}$ C. or less, as in the stage apparatus 1. Hence strict positioning precision can be ensured also on the reticle side, as on the wafer side. In particular, as with the exposure apparatus of this embodiment, when a plurality of reticles R1 and R2 are held on the reticle stage RST, the distance between the reticle R1 and the mobile mirrors 35 and 37 increases, and a positioning error due to the thermal expansion increases even with a slight temperature change. By using ceramics having a coefficient of thermal expansion of $1.0 \times 10^{-6}/°$ C. or less, however, a positioning error of not more than 1 nm can be easily ensured.

In the above described embodiment, the construction is such that the tables for holding the wafer holders and mobile mirrors, or the reticle holders and mobile mirrors, and the wafer stages WS1 and WS2 and the reticle stage RST comprise a cordierite type ceramics. However, the construction is not limited to this, and may be such that, for example, the upper face of the table is coated with ceramics, or the upper and lower faces of the reticle stage RST are coated with ceramics by thermal spraying or the like. Also, the ceramics provided on the upper face of the surface plate 12 is not limited to one formed by surface treatment, and the construction may be such that a ceramics plate is adhered thereto.

Moreover, with the above embodiment, the construction is such that the ceramics having low thermal expansion is a cordierite type ceramics, but this is not limited thereto, as long as a coefficient of thermal expansion of not higher than $1.0 \times 10^{-6}/°$ C. or not higher than $0.5 \times 10^{-6}/°$ C. can be realized.

Also, with the above embodiment, the construction is such that the stage apparatus of the present invention is applied to the wafer stage and the reticle stage portion in the projection exposure apparatus 10. However this can be applied to precision measuring equipment such as a drawing apparatus for a transfer mask, a position coordinate measuring apparatus for a mask pattern or the like, in addition to the projection exposure apparatus 10.

As a substrate in this embodiment, not only semiconductor wafers W1 and W2 for the semiconductor devices, but also a glass substrate for a liquid crystal display device, a ceramic wafer for a thin-film magnetic head, or a mask used in an exposure apparatus or an original plate of a reticle (synthetic quartz, silicon wafers) are applicable.

As a projection exposure apparatus 10, in addition to the scanning exposure apparatus of the step and scan type (scanning stepper; U.S. Pat. No. 5,473,410) wherein a pattern of a reticle R is scanned and exposed by simultaneously moving the reticle R and a wafer W, a projection exposure apparatus of the step and repeat type (stepper) wherein a pattern of a reticle R is exposed in a state with the reticle R and a wafer W stationary and the wafer W is sequentially shifted step by step is applicable.

As kinds of projection exposure apparatus 10, the projection exposure apparatus 10 can be widely applied not only to an exposure apparatus for producing semiconductor devices wherein a semiconductor device pattern is exposed on a wafer W, but also to an exposure apparatus for producing a liquid crystal display device, a thin-film magnetic head, an image-sensing device (CCD) or an exposure apparatus for producing reticles.

The magnification of the projection optical system PL may involve not only a reduction system but may also involve an equal magnification or enlarging system. Moreover, as the projection optical system PL, when a far-ultraviolet ray such as an excimer laser is used, a material which transmits the far-ultraviolet ray, such as quartz or fluorite, is used as the glass material, and when an $F_2$ laser or X-ray is used, a reflection/refraction system or a refraction system is used as the optical system (also as the reticle R, one of a reflection type is used), or when an electron beam is used, an electronic optical system consisting of an electron lens and a deflecting system may be used as the optical system. Here, needless to say, the optical path along which the electron beam passes is evacuated.

When a linear motor is used for the wafer stages WS1 and WS2 and the reticle stage RST (see U.S. Pat. No. 5,623,853 or U.S. Pat. No. 5,528,118), either of an air floating type using an air bearing or a magnetic floating type using a Lorentz force or a reactance force may be used. Moreover, respective stages WS1, WS2 and RST may be of a type which move along a guide, or a guideless type without a guide.

As the drive mechanism for the respective stages WS1, WS2 and RST, a planar motor may be used wherein a magnetic unit in which magnets are arranged two-dimensionally (permanent magnets) and an armature unit in which coils are arranged two-dimensionally are made to face each other, and respective stages WS1, WS2 and RST are driven by an electromagnetic force. In this case, either the magnetic unit or the armature unit is connected to the stages WS1, WS2 and RST, and the other of the magnetic unit and the armature unit may be provided on the moving plane side (base side) of the stages WS1, WS2 and RST.

The reaction force generated by the movement of the wafer stages WS1 and WS2 may be removed mechanically to the floor (ground) using a frame member, so as not to be transmitted to the projection optical system PL, as described in Japanese Unexamined Patent Application, First Publication No. Hei 8-166475 (U.S. Pat. No. 5,528,118).

The reaction force generated by the movement of the reticle stage RST may be removed mechanically to the floor (ground) using a frame member, so as not to be transmitted to the projection optical system PL, as described in Japanese Unexamined Patent application, First Publication No. Hei 8-330224 (U.S. Pat. No. 6,020,710). The present invention is applicable to an exposure apparatus having such a construction.

As described above, the projection exposure apparatus 10 of the embodiment of this application is produced by assembling various sub-systems including respective constituents mentioned in the claims of this application, so as to maintain a predetermined mechanical precision, electrical precision and optical precision. To ensure these various precisions, there are performed adjustments for obtaining the optical precision with respect to various optical systems, adjustments for obtaining the mechanical precision with respect to various mechanical systems and adjustments for obtaining the electrical precision with respect to various electrical systems, prior to assembly. The assembly process from various sub-systems to the exposure apparatus includes mechanical connection, wiring connection of electric circuits and piping connection of pneumatic circuits between various sub-systems. Prior to the assembly process from various sub-systems to the exposure apparatus, there is, of course, an assembly process of each sub-system. After the assembly process from various sub-systems to the exposure apparatus has been completed, comprehensive adjustment is performed, to thereby ensure various precisions for the overall exposure apparatus. In addition, it is desirable that the production of the exposure apparatus be performed in a clean room wherein the temperature, the degree of cleanness and the like are controlled.

Figure 4:
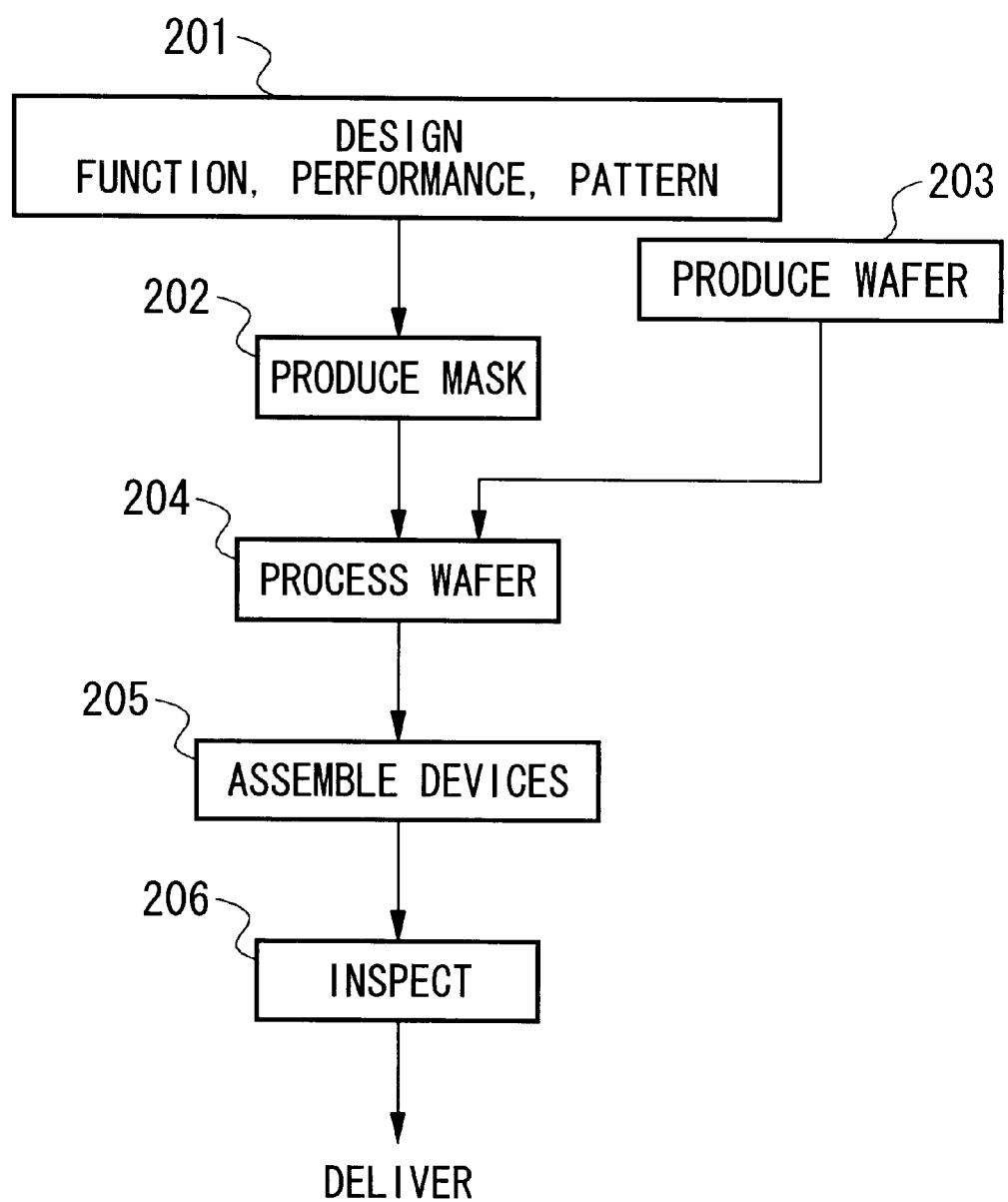
FIG. 4 is a flow chart illustrating one example of a production process for semiconductor devices.

A micro device such as a semiconductor device or the like is produced, as shown in FIG. 4, through steps such as: a step 201 for designing the function and performance of a micro device, a step 202 for producing masks (reticles) based on the designing step, a step 203 for producing wafers from a silicon material, an exposure processing step 204 for exposing a pattern of a reticle to a wafer by means of the projection exposure apparatus 10 in the above described embodiment, a device assembly step (including a dicing step, a bonding step and a packaging step) 205, and an inspection step 206.

The whole description of Japanese Patent Application No. 8-332844 filed on Nov. 28, 1996, including the specification, scope of claims, drawings and abstract, and the whole description of U.S. patent application Ser. No. 08/980,315 filed on Nov. 28, 1997 are incorporated herein by reference.

What is claimed is:

1. A stage apparatus comprising:
    a holder that holds a substrate; and
    a position detection device that detects a position of the substrate, based on reflected light from a mobile mirror provided at a predetermined positional relationship with the holder,
    wherein the holder and a base material of the mobile mirror comprise a nonmagnetic material having a coefficient of thermal expansion of $1 \times 10^{-6}/°$ C. or less and a Young's modulus of not smaller than 215 GPa.

2. A stage apparatus according to claim 1, wherein the holder and the base material of the mobile mirror comprise a ceramic having a coefficient of thermal expansion of $1 \times 10^{-6}/°$ C. or less.

3. A stage apparatus according to claim 1, wherein the mobile mirror and the holder are held by a common base.

4. A stage apparatus according to claim 3, wherein at least a part of the base is a ceramic.

5. A stage apparatus according to claim 1, wherein a movable stage for integrally moving the mobile mirror and the holder is provided.

6. A stage apparatus according to claim 5, wherein at least a part of the movable stage is a ceramic.

7. A stage apparatus according to claim 5, further comprising a support member that movably supports the movable stage.

8. A stage apparatus according to claim 7, wherein at least a part of the support member is a ceramic.

9. A stage apparatus according to claim 1, wherein the holder and the base material of the mobile mirror comprise a ceramics having a Young's modulus of not smaller than 215 Gpa.

10. A stage apparatus according to claim 1, further comprising a chamber that surrounds the stage apparatus and controls a temperature of the stage apparatus.

11. A stage apparatus according to claim 1, wherein the non-magnetic material is a ceramic.

12. A holder for holding a substrate, having a plurality of protruding members arranged at approximately even spacing for supporting the substrate, and the plurality of protruding members comprise a non-magnetic material having a coefficient of thermal expansion of $1 \times 10^{-6}/°$ C. or less, the plurality of protruding members being surface-treated with silicone carbide (SiC).

13. A holder according to claim 12, wherein the plurality of protruding members have a coefficient of thermal expansion of $0.5 \times 10^{-6}/°$ C. or less.

14. A holder according to claim 12, wherein the plurality of the protruding members comprise a ceramics having a Young's modulus of not smaller than 215 Gpa.

15. A holder according to claim 12, wherein the non-magnetic material is a ceramic.

16. A scanning exposure apparatus for exposing a pattern on a substrate while a stage is moving in a first direction, comprising:
   a holder that holds the substrate, the holder being associated with the stage to move in the first direction; and
   a position detection device that detects a position of the substrate, based on reflected light from a mobile mirror provided at a predetermined positional relationship with the holder,
   wherein the holder and a base material of the mobile mirror comprise a nonmagnetic material having a coefficient of thermal expansion of $1\times10^{-6}/°$ C. or less.

17. A scanning exposure apparatus according to claim 16, wherein the holder and the base material of the mobile mirror comprise a ceramic having a coefficient of thermal expansion of $1\times10^{-6}/°$ C. or less.

18. A scanning exposure apparatus according to claim 16, wherein the stage is a substrate stage for moving the substrate via the holder.

19. A scanning exposure apparatus according to claim 18, wherein a plurality of the substrate stages are provided.

20. A scanning exposure apparatus according to claim 16, wherein the stage is a mask stage for moving a mask on which the pattern is formed.

21. A scanning exposure apparatus according to claim 20, wherein the mask stage moves, holding a plurality of masks.

22. A scanning exposure apparatus according to claim 16, wherein the holder and the base material of the mobile mirror comprise a ceramics having a Young's modulus of not smaller than 215 Gpa.

23. A scanning exposure apparatus according to claim 16, further comprising a chamber that surrounds at least a part of the scanning exposure apparatus and controls a temperature of at least a part of the scanning exposure apparatus.

24. A scanning exposure apparatus according to claim 16, wherein the non-magnetic material is a ceramic.

25. An exposure apparatus for exposing a pattern on a substrate, wherein the substrate is held by a holder having a plurality of protruding members arranged at approximately equal spacing, and the plurality of protruding members comprise a ceramic having a coefficient of thermal expansion of $1\times10^{-6}/°$ C. or less.

26. An exposure apparatus according to claim 25, wherein the plurality of protruding members have a coefficient of thermal expansion of $0.5\times10^{-6}/°$ C. or less.

27. An exposure apparatus according to claim 25, wherein the plurality of protruding members are surface-treated with silicon carbide (SiC).

* * * * *